(12) United States Patent  
Okinaka et al.

(10) Patent No.: US 7,466,074 B2  
(45) Date of Patent: Dec. 16, 2008

(54) ORGANIC LIGHT-EMITTING DEVICE

(75) Inventors: Keiji Okinaka, Kawasaki (JP); Naoki Yamada, Tokyo (JP); Akihito Saitoh, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 292 days.

(21) Appl. No.: 11/548,893

(22) Filed: Oct. 12, 2006

(65) Prior Publication Data

US 2007/0205713 A1   Sep. 6, 2007

(30) Foreign Application Priority Data

Dec. 16, 2005   (JP) .............................. 2005-362611

(51) Int. Cl.  
*H01J 1/62* (2006.01)

(52) U.S. Cl. ...................... 313/504; 313/506

(58) Field of Classification Search ................. 313/503, 313/504, 506; 428/690, 977  
See application file for complete search history.

(56) References Cited

U.S. PATENT DOCUMENTS 7,034,454 B2   4/2006  Kawai et al. ................ 313/504

2006/0017376 A1   1/2006  Okinaka et al. ............. 313/504

FOREIGN PATENT DOCUMENTS

JP   2002-359080   12/2002

OTHER PUBLICATIONS

Sakamoto, G. et al., "Significant improvement of device durability in organic light-emitting diodes by doping both hole transport and emitter layers with rubrene molecules", Appl. Phys. Lett., 75 (6), pp. 766-768, 1999.

*Primary Examiner*—Joseph L Williams  
(74) *Attorney, Agent, or Firm*—Fitzpatrick, Cella, Harper & Scinto

(57) ABSTRACT

In an organic light-emitting device which uses, in particular, a light-emitting layer material having a wide band gap, a lowering in emission intensity due to continuous driving is alleviated while maintaining a high emission efficiency. There is provided an organic light-emitting device in which a hole-transporting layer contains a second component in addition to a main component; an energy of a lowest triplet excited state of the second component is less than an energy of a lowest triplet excited state of the main component of the hole-transporting layer; a lowest unoccupied molecular orbital energy of the second component is higher than a lowest unoccupied molecular orbital energy of the main component of a light-emitting layer; and the second component has an energy gap of 2.7 eV or more.

5 Claims, 3 Drawing Sheets

ORGANIC LIGHT-EMITTING DEVICE

BACKGROUND OF THE INVENTION

1. Field of the Invention

The present invention relates to a light-emitting device using an organic compound, and more specifically, to an organic light-emitting device that emits light by applying an electric field to a thin film composed of an organic compound.

2. Description of the Related Art

An organic light-emitting device suggests its potential to find use in a wide variety of applications owing to its characteristics such that the device can be formed into a thin, lightweight light-emitting device which shows high luminance at a low applied voltage; has a variety of emission wavelengths; and provides high-speed response. However, particularly when considering its application to, for example, a full-color display, the stability of the existing device is not sufficient for putting into practical use, so that an additional improvement in stability has been needed.

Japanese Patent Application Laid-Open No. 2002-359080 discloses a method of improving the durability in continuous drive of a device by incorporating therein a light-emitting material and a triplet capturing agent to reduce the triplet excited state of the light-emitting material.

Further, Applied Physics Letters, Volume 75, Number 6, (1999) discloses doping a hole-transporting layer with rubrene to improve the durability in continuous drive of a device. However, according to this technique, the rubrene contained in the hole-transporting layer emits a strong yellow light, so that the device cannot be applied to a light-emitting device for emitting a green light or blue light.

One of the causes for the degradation of an organic light-emitting device by driving is that a hole-transporting material which constitutes a hole-transporting layer is degraded by going through a triplet excited state. That is, when electron leakage from a light-emitting layer to the hole-transporting layer occurs, holes and electrons recombine in the hole-transporting layer, so that excited singlet states and triplet excited states are generated at a probability ratio of 1:3. Therefore, the triplet excited state generated in a larger amount is important in the context of the degradation. Moreover, the triplet excited state generally has a long lifetime of an order of ms or more, so that degradation such as decomposition due to going through a triplet excited state and the like becomes a problem.

In addition, in order that excitons are efficiently formed in a light-emitting layer to thereby allow the layer to emit light, the energy gap E1 of a main component which constitutes the light-emitting layer and the energy gap E2 of a main component which constitutes a hole-transporting layer satisfy at least the relationship of E1<E2. However, in cases where a material having a large energy gap E1 is used as is the case where the emission color is blue, such energy relationship is sometimes not satisfied, so that the degradation of the hole-transporting material becomes significant.

SUMMARY OF THE INVENTION

It is, therefore, an object of the present invention to alleviate the lowering in emission intensity due to continuous driving of an organic light-emitting device, in particular, an organic light-emitting device using a light-emitting layer material having a wide band gap, while maintaining a high emission efficiency.

The present inventors have conducted extensive studies with a view to solving the above-mentioned problems. As a result, they have completed the present invention.

That is, according to one aspect of the present invention, there is provided an organic light-emitting device which comprises a pair of electrodes including an anode and a cathode; and a light-emitting layer and a hole-transporting layer disposed between the pair of electrodes, an energy gap E1 of a main component of the light-emitting layer and an energy gap E2 of a main component of the hole-transporting layer satisfying the relationship of E2−E1≦0.3 eV, wherein the hole-transporting layer comprises a second component in addition to the main component of the hole-transporting layer;

(1) an energy of a lowest triplet excited state of the second component is less than an energy of a lowest triplet excited state of the main component of the hole-transporting layer;

(2) a lowest unoccupied molecular orbital energy of the second component is higher than a lowest unoccupied molecular orbital energy of the main component of the light-emitting layer; and (3) the second component has an energy gap of 2.7 eV or more.

Incidentally, the term "hole-transporting layer" as herein employed refers to a layer which is positioned between a light-emitting layer and an anode, preferably adjacent to the light-emitting layer, and mainly injects/transports holes.

In addition, the term "main component" as herein employed refers to a component which is present in a concentration of more than 50 wt %, preferably in a concentration of 80 wt % or more.

According to the present invention, the lowering in emission intensity due to continuous driving can be alleviated even in an organic light-emitting device using a light-emitting layer material having a wide band gap while a high emission efficiency is maintained.

Further features of the present invention will become apparent from the following description of exemplary embodiments with reference to the attached drawings.

DESCRIPTION OF THE EMBODIMENTS

In the present invention, in order that the above-mentioned degradation of the hole-transporting material due to going through a triplet excited state may be prevented, the hole-transporting layer contains a second component in addition to the main component. The content of the second component is preferably 0.01 wt. % or more but less than 50 wt. %, more preferably 0.1 wt. % or more but less than 20 wt. %.

Further, it is necessary that (1) an energy of a lowest triplet excited state (T1 energy) of the second component is less than a T1 energy of the main component of the hole-transporting layer. Thereby, even when a triplet excited state of the main component is generated in the hole-transporting layer, rapid energy transfer to the triplet excited state of the second component becomes possible. Therefore, the degradation of the main component of the hole-transporting layer due to going through a triplet excited state can be prevented.

Figure 5:
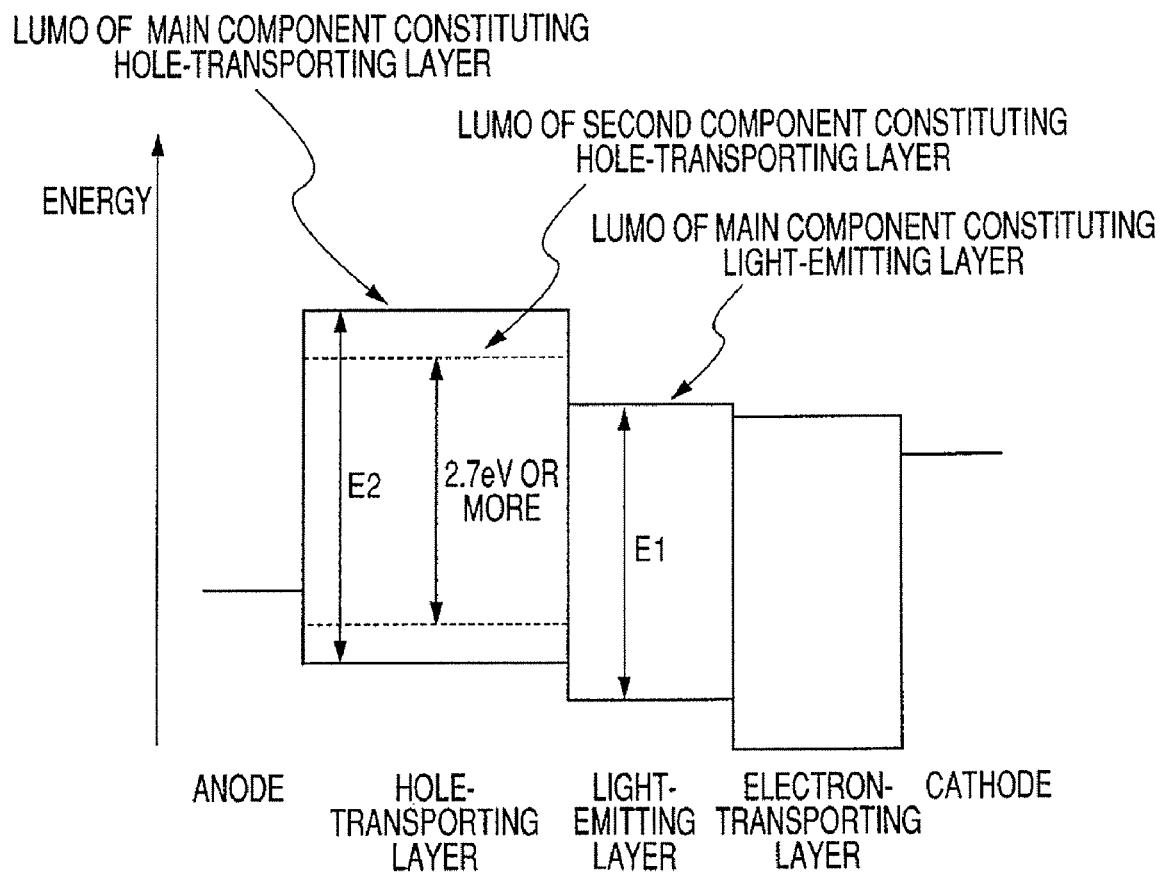
FIG. 5 is a schematic cross-sectional view showing the energy levels of an example of the organic light-emitting device in accordance with the present invention.

Moreover, as shown in FIG. 5, it, is necessary that (2) a lowest unoccupied molecular orbital (LUMO) energy of the second component is higher than a LUMO energy of the main component of the light-emitting layer (that is, the second component has a smaller electron affinity than the electron affinity of the main component of the light-emitting layer). Thereby, electrons in the light-emitting layer are prevented from flowing into the second component. When electrons flow into the second component, there is generated a disadvantage that the second component emits light, whereby color mixing with the color of light emitted by the light-emitting layer is caused, or the emission efficiency of the entire device is reduced.

In addition, it is necessary that (3) the second component has an energy gap of 2.7 eV or more. When the energy gap is excessively small, there is generated a disadvantage that energy transfer from an excited state generated in the light-emitting layer to the second component occurs. In order that the device can be used at various emission wavelengths in the visible region, the energy gap needs to be 2.7 eV or more.

In the organic light-emitting device of the present invention, the energy gap E1 of the main component of the light-emitting layer and the energy gap E2 of the main component of the hole-transporting layer satisfy the relationship of E2−E1≦0.3 eV. For example, in the case of a device whose emission color is blue, the present invention functions more effectively because electron leakage from a light-emitting layer to a hole-transporting layer becomes significant and the degradation of a hole-transporting material also becomes significant.

The triplet excited states of the main component of the hole-transporting layer are generated by electron leakage from the light-emitting layer, and are therefore produced in a larger number in a portion on the light-emitting layer side of the hole-transporting layer. Therefore, it is preferable that the second component is contained in at least a portion on the light-emitting layer side of the hole-transporting layer.

Further, it is desirable that the second component that has received a triplet energy from the main component of the hole-transporting layer rapidly returns to the ground state. The reason is that when remained in a triplet excited state for a long period of time, the possibility increases that the second component will cause degradation such as decomposition. It is generally known that the lower the T1 energy, the shorter the lifetime of a triplet excited state. Therefore, it is preferred that the T1 energy of the second component is 2.2 eV or less.

It is preferable that the second component has a fused polycyclic aromatic ring having 14 or more carbon atoms. Examples of the fused polycyclic aromatic ring having 14 or more carbon atoms include anthracene, pyrene, perylene, naphthacene, phenanthrene, chrysene, triphenylene, and coronene. The presence of any one of those skeletons makes it easy to obtain a material having a low T1 energy.

The second component is mixed into the hole-transporting layer and is therefore required to transport holes rapidly and also to be stable when transporting holes. In order to satisfy these requirements, it is preferable that the second component has a triarylamine structure that has been hitherto known as the skeleton of a hole-transporting material. Specific examples of such structure include, but not limited to, those structures shown below.

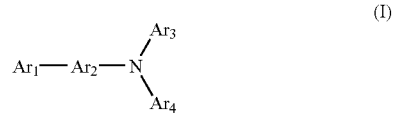

(I)

In the general formula [I], $Ar_1$ represents a substituted or unsubstituted fused polycyclic aromatic ring with a main skeleton having 14 or more carbon atoms;

$Ar_2$ represents a substituted or unsubstituted alkylene group, aralkylene group, arylene group, or divalent heterocyclic group; and $Ar_3$ and $Ar_4$ each represent, independently of one another, a substituted or unsubstituted alkyl group, aralkyl group, aryl group, or heterocyclic group, or may be joined to form a ring.

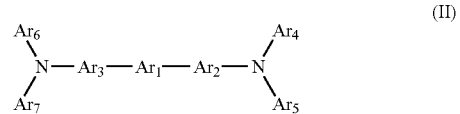

(II)

In the general formula [II], $Ar_1$ represents a substituted or unsubstituted fused polycyclic aromatic ring with a main skeleton having 14 or more carbon atoms;

$Ar_2$ and $Ar_3$ each represent, independently of one another, a substituted or unsubstituted alkylene group, aralkylene group, arylene group, or divalent heterocyclic group; and $Ar_4$, $Ar_5$, $Ar_6$, and $Ar_7$ each represent, independently of one another, a substituted or unsubstituted alkyl group, aralkyl group, aryl group, or heterocyclic group, or $Ar_4$ and $Ar_5$, or $Ar_6$ and $Ar_7$ may be joined to form a ring.

Examples of the substituted or unsubstituted alkyl group include, but are not limited to, methyl group, methyl-d1 group, methyl-d3 group, ethyl group, ethyl-d5 group, n-propyl group, n-butyl group, n-pentyl group, n-hexyl group, n-heptyl group, n-octyl group, n-decyl group, iso-propyl group, iso-propyl-d7 group, iso-butyl group, sec-butyl group, tert-butyl group, tert-butyl-d9 group, iso-pentyl group, neo-pentyl group, tert-octyl group, fluoromethyl group, difluoromethyl group, trifluoromethyl group, 2-fluoroethyl group, 2,2,2-trifluoroethyl group, perfluoroethyl group, 3-fluoropropyl group, perfluoropropyl group, 4-fluorobutyl group, perfluorobutyl group, 5-fluoropentyl group, 6-fluorohexyl group, chloromethyl group, trichloromethyl group, 2-chloroethyl group, 2,2,2-trichloroethyl group, 4-chlorobutyl group, 5-chloropentyl group, 6-chlorohexyl group, bromomethyl group, 2-bromoethyl group, iodomethyl group, 2-iodoethyl group, hydroxymethyl group, hydroxyethyl group, cyclopropyl group, cyclobutyl group, cyclopentyl group, cyclohexyl group, cyclopentylmethyl group, cyclohexylmethyl group, cyclohexylethyl group, 4-fluorocyclohexyl group, norbornyl group, and adamantyl group.

Examples of the substituted or unsubstituted aralkyl group include, but are not limited to, benzyl group, 2-phenylethyl group, 2-phenylisopropyl group, 1-naphthylmethyl group, 2-naphthylmethyl group, 2-(1-naphthyl)ethyl group, 2-(2-naphthyl)ethyl group, 9-anthrylmethyl group, 2-(9-anthryl)ethyl group, 2-fluorobenzyl group, 3-fluorobenzyl group, 4-fluorobenzyl group, 2-chlorobenzyl group, 3-chlorobenzyl group, 4-chlorobehzyl group, 2-bromobenzyl group, 3-bromobenzyl group, and 4-bromobenzyl group.

Examples of the substituted or unsubstituted aryl group include, but are not limited to, phenyl group, phenyl-d5 group, 4-methylphenyl group, 4-methoxyphenyl group, 4-ethylphenyl group, 4-fluorophenyl group, 4-trifluorophenyl group, 3,5-dimethylphenyl group, 2,6-diethylphenyl group, mesityl group, 4-tert-butylphenyl group, ditolylaminophenyl group, biphenyl group, terphenyl group, naphthyl group, naphthyl-d7 group, acenaphthylenyl group, anthryl group, anthryl-d9 group, phenanthryl group, phenanthryl-d9 group, pyrenyl group, pyrenyl-d9 group, acephenanthrylenyl group, aceanthrylenyl group, chrysenyl group, dibenzochrysenyl group, benzoanthryl group, benzoanthryl-d11 group, dibenzoanthryl group, naphthacenyl group, picenyl group, pentacenyl group, fluorenyl group, triphenylenyl group, perylenyl group, and perylenyl-d-11 group.

Examples of the substituted or unsubstituted heterocyclic group include, but are not limited to, pyrrolyl group, pyridyl group, bipyridyl group, methylpyridyl group, terpyrrolyl group, thienyl group, terthienyl group, propylthienyl group, furyl group, indolyl group, 1,10-phenanthroline group, phenazinyl group, quinolyl group, carbazolyl group, oxazolyl group, oxadiazolyl group, thiazolyl group, and thiadiazolyl group.

Examples of the substituted or unsubstituted alkylene group include, but not limited to, methylene group, difluoromethylene group, ethylene group, perfluoroethyleneo group, propylene group, iso-propylene group, butylene group, and 2,2-dimethylpropylene group.

Examples of the substituted or unsubstituted aralkylene group include, but are not limited to, benzylene group, 2-phenylethylene group, 2-phenylisopropylene group, 1-naphthylmethylene group, 2-naphthylmethylene group, 9-anthrylmethylene group, 2-fluorobenzylene group, 3-fluorobenzylene group, 4-fluorobenzylene group, 4-chlorobenzyl group, and 4-bromobenzylene group.

Examples of the substituted or unsubstituted arylene group include, but are not limited to, phenylene group, biphenylene group, tetrafluorophenylene group, dimethylphenylene group, naphthylene group, phenanthrylene group, pyrenylene group, tetracenylene group, pentacenylene group and perylenylene group.

Examples of the substituted or unsubstituted divalent heterocyclic group include, but are not limited to, furylene group, pyrrolylene group, pyridylene group, terpyridylene group, thienylene group, terthienylene group, oxazolylene group, thiazolylene group and carbazolylene group.

An energy gap can be measured from a visible light-ultraviolet absorption spectrum. In the present invention, the energy gap was determined from the absorption edge of a thin film formed on a glass substrate. A spectrophotometer U-3010 (trade name) manufactured by Hitachi, Ltd. was used as a measuring apparatus.

In the present invention, an ionization potential and a highest occupied molecular orbital (HOMO) energy were measured by using photoelectron spectroscopy in air (PESA; measuring apparatus used: AC-1 (trade name) manufactured by RIKEN KIKI CO., LTD.). In the present invention, a method of calculating an electron affinity and a lowest unoccupied molecular orbital (LUMO) energy from a value for an HOMO energy and an energy gap was employed. That is, LUMO energy=HOMO energy+energy gap.

The energy (T1 energy) of a lowest triplet excited state can be determined from a phosphorescence spectrum.

The energy is estimated from a first light emission peak (peak having the shortest wavelength) of a phosphorescence spectrum at a low temperature such as of liquid-nitrogen temperature (77 K)

In addition, upon molecular design of various materials, each energy can be predicted by a calculation simulation such as a molecular orbital method or density functional method.

In the present invention, light emission in the light-emitting layer may be either fluorescent or phosphorescent.

The organic light-emitting device of the present invention has a pair of electrodes composed of an anode and a cathode, and layers each containing an organic compound including at least a light-emitting layer and a hole-transporting layer, disposed between the pair of electrodes. FIGS. 1 to 5 each show an example of the constitution of the organic light-emitting device of the present invention. Reference numerals used in the respective figures will be described.

Reference numeral 1 denotes a substrate; 2 denotes an anode; 3 denotes a light-emitting layer; 4 denotes a cathode; 5 denotes a hole-transporting layer; 6 denotes an electron-transporting layer; 7 denotes a hole injection layer; and 8 denotes a hole-blocking layer.

Figure 1:
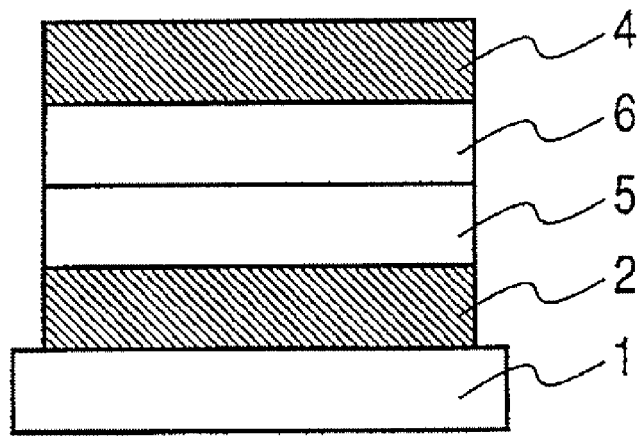
FIG. 1 is a schematic cross-sectional view showing an example of the organic light-emitting device in accordance with the present invention.

FIG. 1 shows a constitution obtained by sequentially providing, on the substrate 1, the anode 2, the hole-transporting layer 5, the electron-transporting layer 6, and the cathode 4. In this case, the electron-transporting layer 6 serves also as a light-emitting layer.

Figure 2:
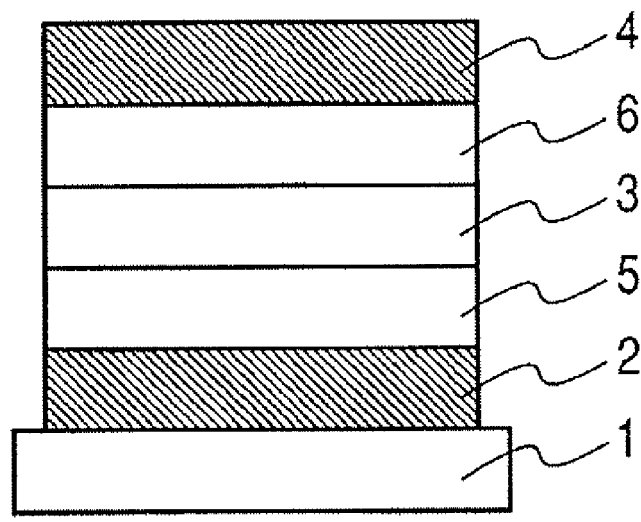
FIG. 2 is a schematic cross-sectional view showing an example of the organic light-emitting device in accordance with the present invention.

FIG. 2 shows a constitution obtained by sequentially providing, on the substrate 1, the anode 2, the hole-transporting layer 5, the light-emitting layer 3, the electron-transporting layer 6, and the cathode 4. In this constitution, a carrier-transporting function and a light-emitting function are separated from each other, and a region in which holes and electrons recombine is present in the light-emitting layer 3. Compounds having respective characteristics of a hole-transporting property, an electron-transporting property, and a light-emitting property are used in a suitable combination, so that the degree of freedom in the selection of materials extremely increases. In addition, because various compounds different from one another in emission wavelength can be used, a wide variety of emission hues can be provided.

Further, the emission efficiency can be improved by effectively confining carriers or excitons within the light-emitting layer 3 as a central layer.

Figure 3:
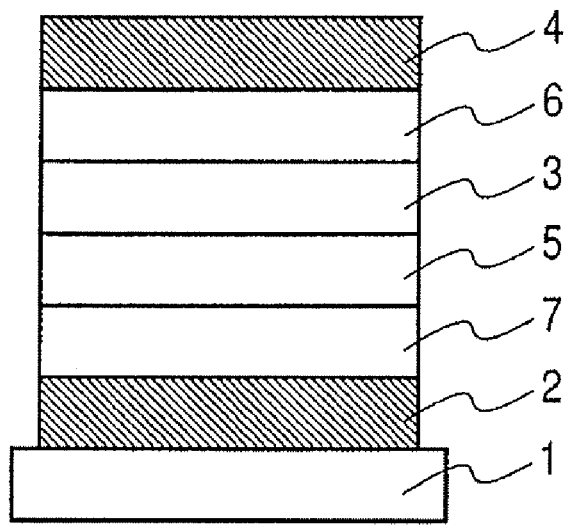
FIG. 3 is a schematic cross-sectional view showing an example of the organic light-emitting device in accordance with the present invention.

FIG. 3 shows a constitution different from that shown in FIG. 2 in that the hole injection layer 7 as one kind of a hole-transporting layer is further provided on the anode 2 side. The layer has an improving effect on adhesiveness between the anode 2 and the hole-transporting layer 5 or on hole injection property, and is effective for reducing the drive voltage.

Figure 4:
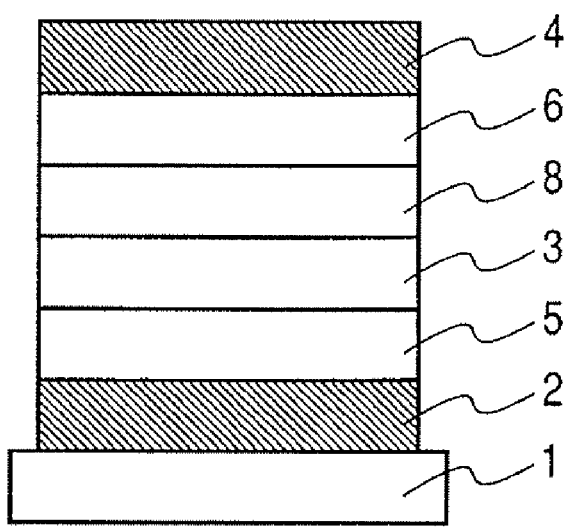
FIG. 4 is a schematic cross-sectional view showing an example of the organic light-emitting device in accordance with the present invention.

FIG. 4 shows a constitution different from that shown in FIG. 2 in that a layer (hole-blocking layer 8) for inhibiting holes from penetrating toward the cathode 4 side is further provided between the light-emitting layer 3 and the electron-transporting layer 6. The constitution is effective for an improvement in emission efficiency when a compound having a large ionization potential (that is, a deep HOMO) is used in the hole-blocking layer 8.

It is preferable that the hole-transporting material as a main component of the hole-transporting layer facilitates injection of holes from an anode and has an excellent mobility for transporting the injected holes to a light-emitting layer. Examples of low molecular and high molecular materials having the hole injecting/transporting capability include a triarylamine derivative, a phenylenediamine derivative, a triazole derivative, an oxadiazole derivative, an imidazole derivative, a pyrazoline derivative, a pyrazolone derivative, an oxazole derivative, a fluorenone derivative, a hydrazone derivative, a stilbene derivative, a phthalocyanine derivative, a porphyrin derivative, poly(vinylcarbazole), poly(silylene), poly(thiophen) and other conductive polymers, but is not limited to them. Representative examples thereof will be shown below.
Low Molecular Hole-transporting Materials
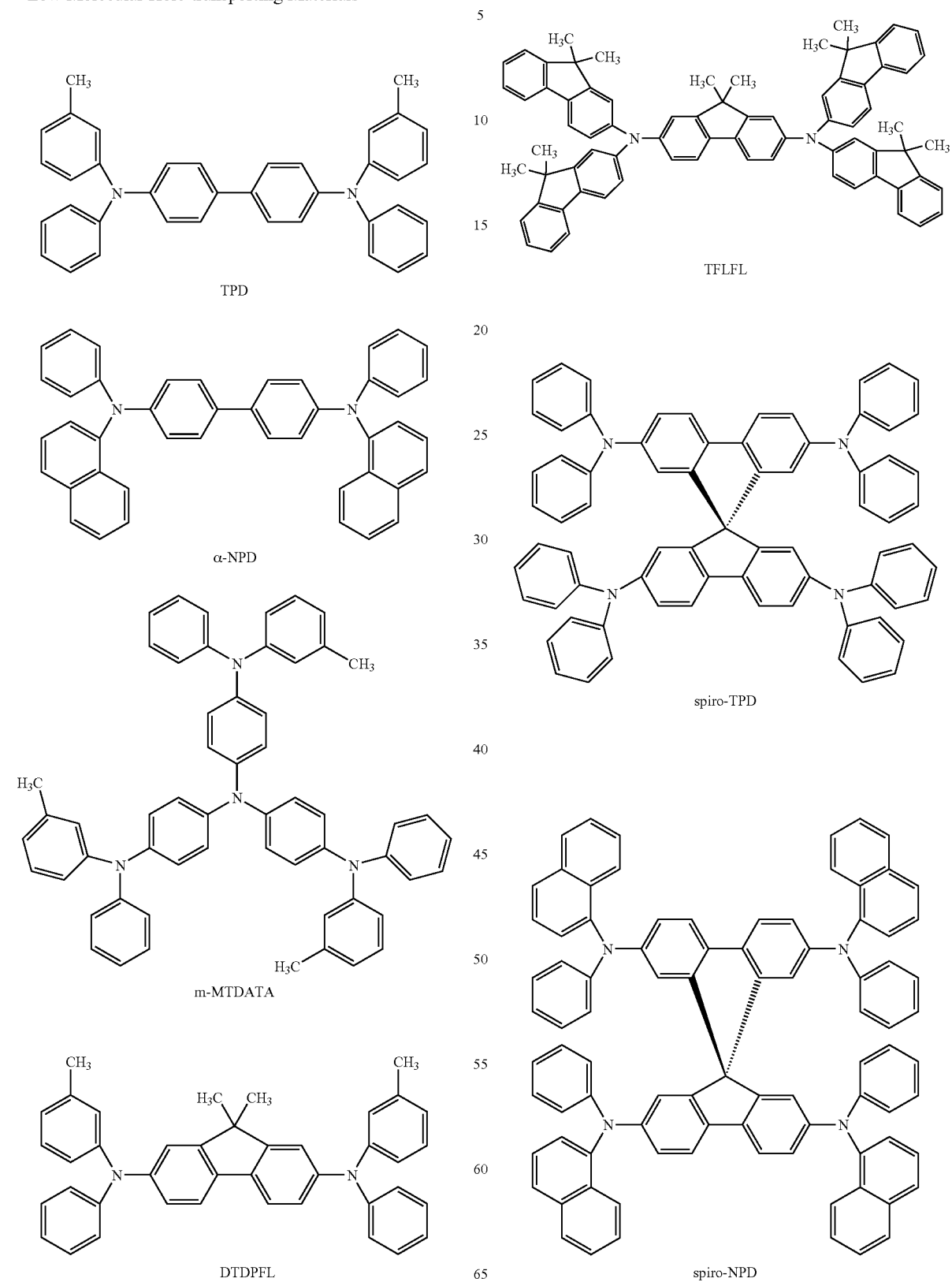

-continued
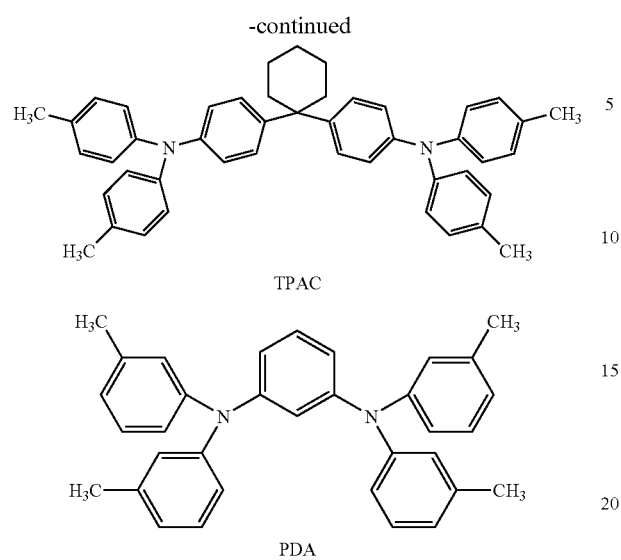
TPAC
PDA
-continued
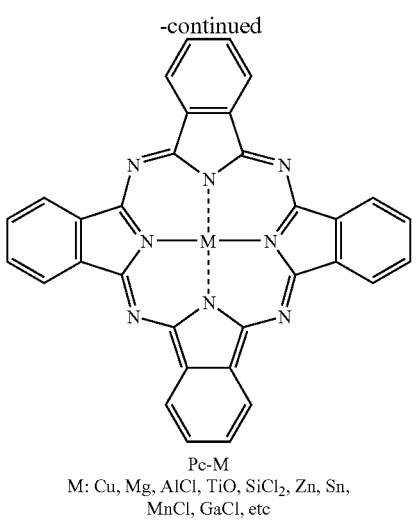
Pc-M
M: Cu, Mg, AlCl, TiO, SiCl$_2$, Zn, Sn,
MnCl, GaCl, etc
High Molecular Hole-transporting Materials
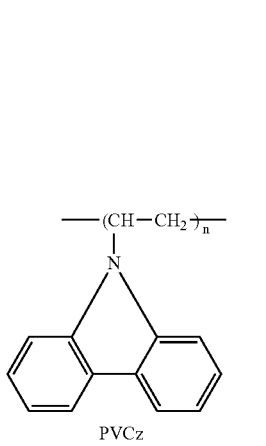
PVCz
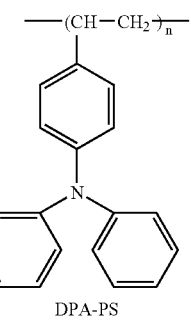
DPA-PS
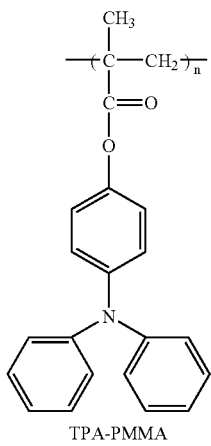
TPA-PMMA
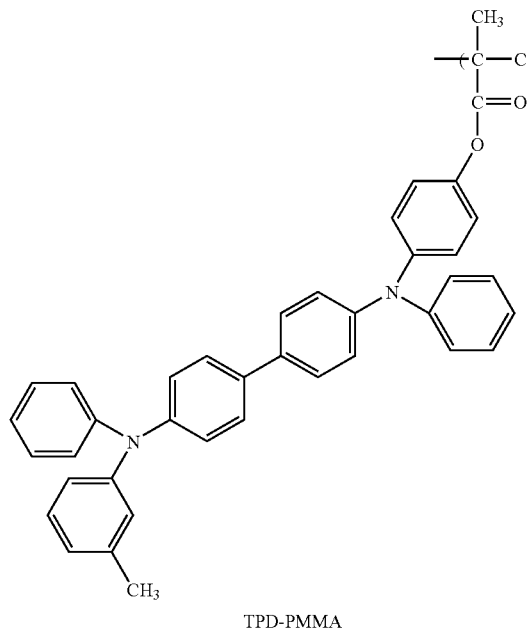
TPD-PMMA
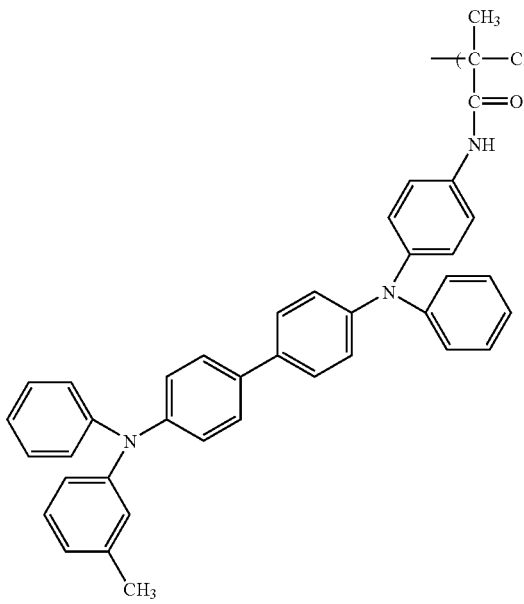
TPD-PMAA

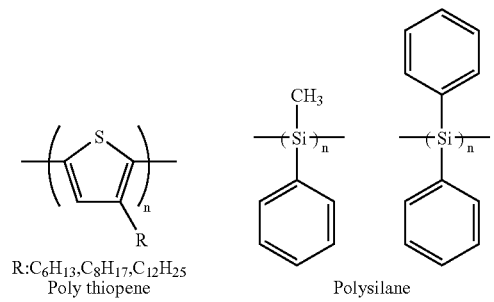

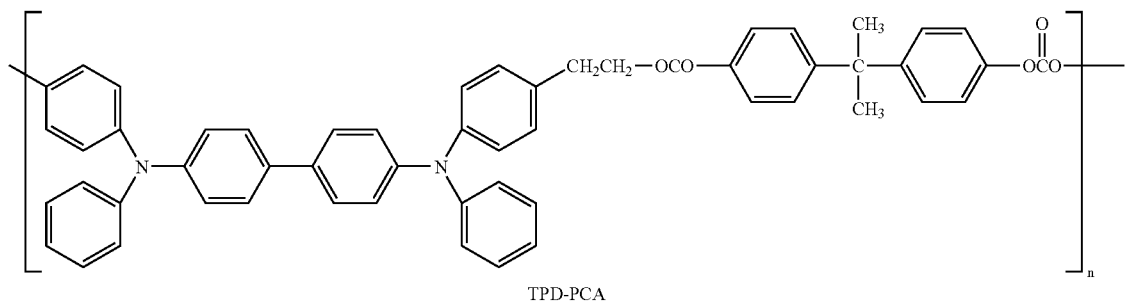

The electron injecting/transporting material can be arbitrarily selected from those materials which facilitate injection of electrons from a cathode and have a function of transporting the injected electrons to a light-emitting layer, and is selected in consideration of a balance with the carrier mobility of the hole-transporting material. Examples of the material having electron injecting/transporting capability include, but is not limited to, an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative and an organometallic complex. Further, a material having a large ionization potential can be used as a hole-blocking material. Representative examples will be shown below.

-continued

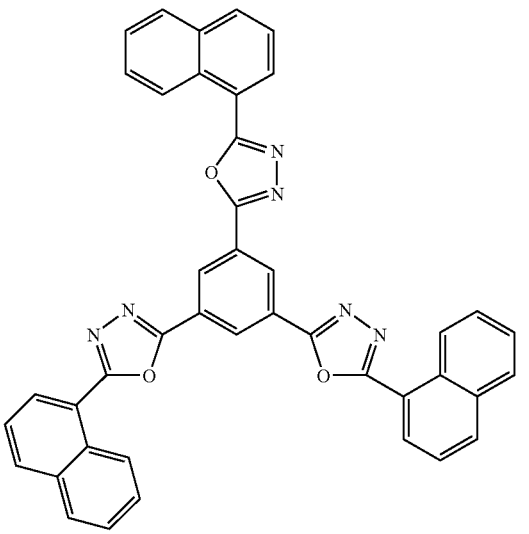

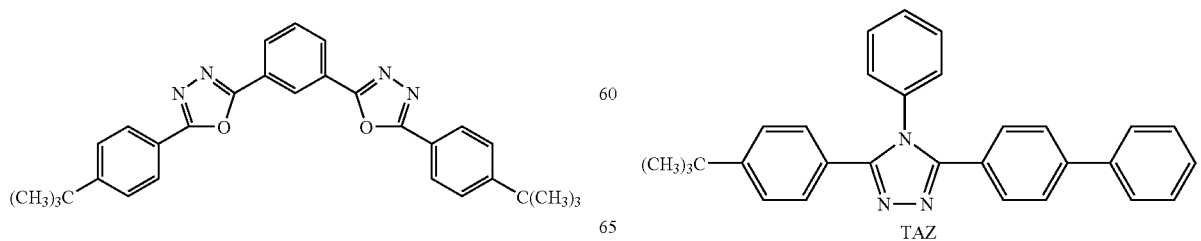

-continued
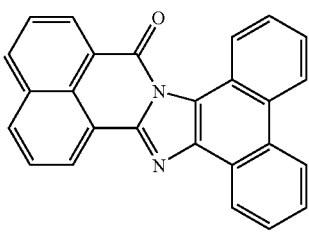
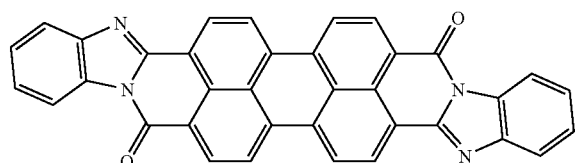
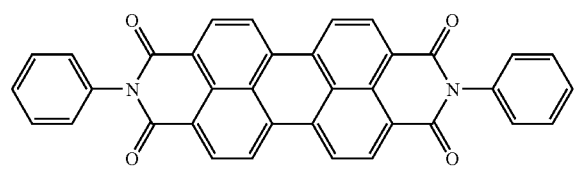
-continued
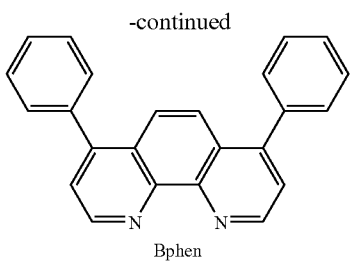
Bphen
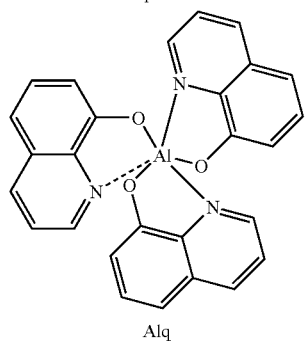
Alq
As the light-emitting material, a fluorescent dye or phosphorescent material having a high emission efficiency is used. Representative examples thereof are shown below.
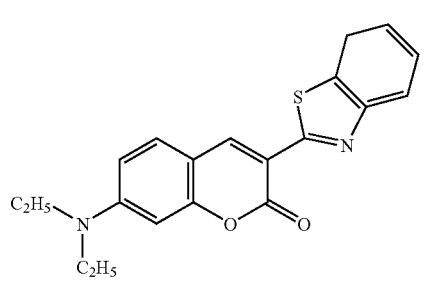
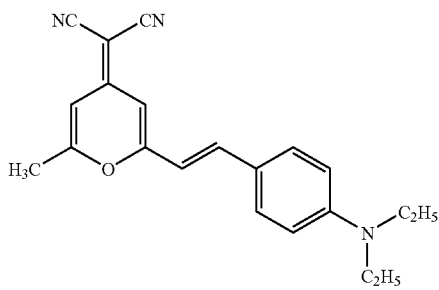
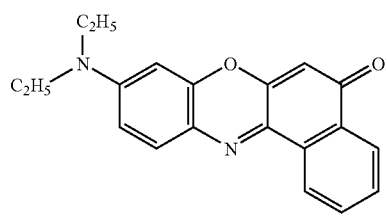
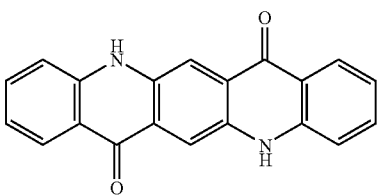
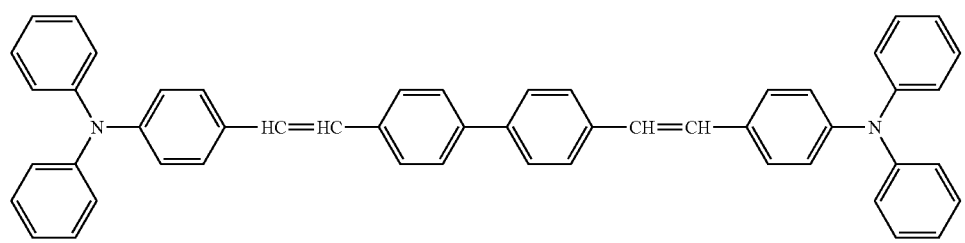

-continued

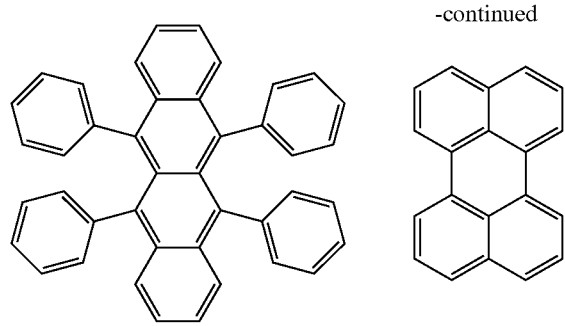
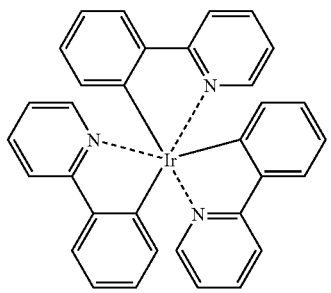

The layer containing an organic compound of the organic light-emitting device of the present invention is formed generally with vacuum deposition method, ion plating method, sputtering, plasma CVD, or the like. Alternatively, they can be formed by using a well-known coating method of applying such organic compound dissolved in a suitable solvent, such as spin coating, dipping, casting, LB method, or ink jet method. Particularly, when the film is formed with the coating method, the film can be formed by additionally using a suitable binder resin.

The above described binder resin can be selected from a wide range of binding resins, and includes, for instance, polyvinylcarbazole resin, polycarbonate resin, polyester resin, polyarylate resin, polystyrene resin, ABS resin, polybutadiene resin, polyurethane resin, acrylic resin, methacrylic resin, butyral resin, polyvinylacetal resin, polyamide resin, polyimide resin, polyethylene resin, polyether sulfonic resin, diallylphthalate resin, phenolic resin, epoxy resin, silicone resin, polysulfonic resin and urea resin, but is not limited to them. In addition, the binder resin may be singly used, or be used in combination as a copolymer. Furthermore, an additive such as a well-known plasticizer, antioxidant, and ultraviolet absorber, as needed.

An anode material used preferably has as large a work function as possible, and includes, for instance, an elemental metal such as gold, platinum, silver, copper, nickel, palladium, cobalt, selenium, vanadium and tungsten, an alloy thereof, and a metal oxide such as stannic oxide, zinc oxide, indium oxide, indium tin oxide (ITO) and indium zinc oxide. Further, a conductive polymer such as polyaniline, polypyrrole, polythiophene and polyphenylene sulfide can be employed. These electrode materials can be used singly or in combination. In addition, the anode may be either of a single layer configuration or of a multilayer configuration.

On the other hand, a cathode material used preferably has a low work function, and include, for instance an elemental metal such as lithium, sodium, potassium, calcium, magnesium, aluminum, indium, ruthenium, titanium, manganese, yttrium, silver, lead, tin, and chromium; or an alloy made of a plurality of the above metals, such as lithium-indium, sodium-potassium, magnesium-silver, aluminum-lithium, aluminum-magnesium, and magnesium-indium. A metal oxide such as indium tin oxide (ITO) can be also used. These electrode materials can be used singly or in combination. In addition, the cathode may be either of a single layer configuration or of a multilayer configuration.

Further, it is preferred that at least one of an anode and a cathode is transparent or translucent.

A substrate used in the present invention is not particularly limited, but an opaque substrate such as a metal substrate and a ceramic substrate or a transparent substrate such as glass, quartz, and a plastic sheet is used. Further, it is also possible to employ, for a substrate, a color filter film, a fluorescent color conversion filter film and a dielectric reflective film to thereby control the emission color. In addition, it is also possible to provide a thin film transistor (TFT) on the substrate and form a device by connecting thereto Further, a plurality of TFTs can be arranged two-dimensionally so as to drive pixels to produce a display. For example, light-emitting pixels for three colors of red, green, and blue can be arranged to serve as a full-color display.

Further, as to the direction in which light is extracted out of the device, any one of a bottom emission configuration (configuration in which light is extracted from a substrate side) and a top emission configuration (configuration in which light is extracted from a side opposite to the substrate side) may be adopted.

Incidentally, after a device has been produced, a protective layer or an encapsulation layer may further be provided, for the purpose of preventing contact with oxygen or moisture. Examples of such a protective layer include a diamond thin film; a film of an inorganic material such as a metal oxide and a metal nitride; a film of a polymer such as a fluororesin, poly-p-xylene, polyethylene, silicone resin, and polystyrene resin; and further a film of a photocurable resin. Further, the produced device may also be covered with glass, a gas-impermeable film and a metal, or be packaged with a suitable encapsulation resin.

EXAMPLES

Hereinafter, the present invention will be described more specifically by way of examples. However, the present invention is not limited to these examples.

Example 1

An organic light-emitting device with a configuration shown in FIG. 2 was produced.

A transparent conductive support substrate was prepared which had a film of indium tin oxide (ITO) with a thickness of 120 nm as an anode 2 formed on a glass sheet as a substrate 1 by a sputtering method. The transparent conductive support substrate was ultrasonically cleaned sequentially with acetone and isopropyl alcohol (IPA), subsequently cleaned with boiled IPA, was dried, was further cleaned with UV/ozone, and was used.

A hole-transporting layer 5 was formed by co-evaporation of TFLFL represented by the formula shown below as a main component and Compound 1 represented by the formula shown below as a second component from separate boats. The layer had a concentration of Compound 1 of 3 wt. % and a thickness of 40 nm.

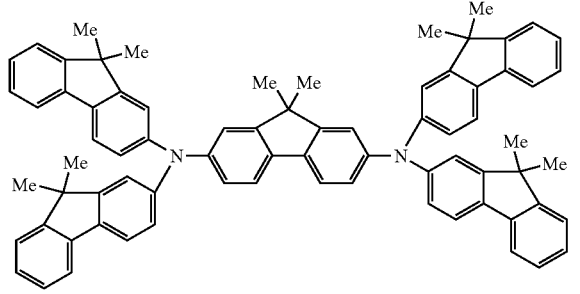

TFLFL

Compound 1

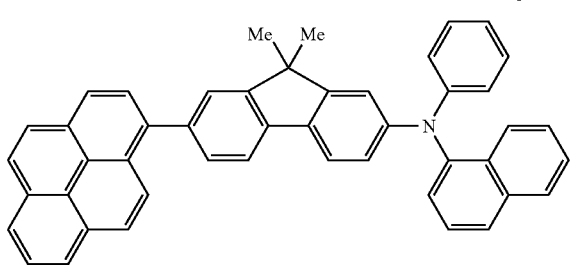

Compound 2

Next, a light-emitting layer 3 was formed by co-evaporation of Compound 2 represented by the formula shown below as a main component and Compound 3 represented by the formula shown below, which was a light-emitting dopant, from separate boats. The layer had a concentration of Compound 3 of 10 wt. % and a thickness of 20 nm.

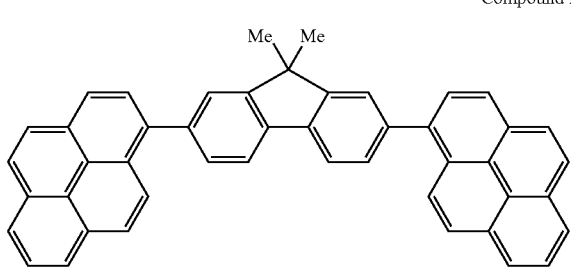

Compound 3

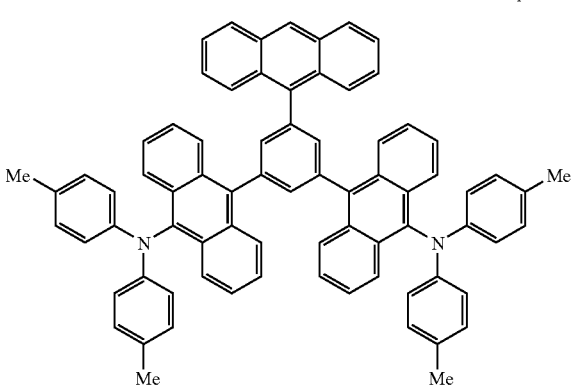

Further, as an electron-transporting layer 6, 2,9-bis[2-(9,9-dimethylfluorenyl)]phenanthroline was formed into a film having a thickness of 30 nm by a vacuum deposition method.

Incidentally, the vacuum degree during the vapor deposition of these organic compound layers was $1.0 \times 10^{-4}$ Pa and the film-forming rate was 0.1 to 0.3 nm/sec.

Next, lithium fluoride (LiF) was formed into a film having a thickness of 0.5 nm by a vacuum deposition method on the electron-transporting layer 6. Further, an aluminum film having a thickness of 150 nm was provided as an electron injection electrode (cathode 4) thereon by a vacuum deposition method, whereby an organic light-emitting device was produced. The vacuum degree during the vapor deposition was $1.0 \times 10^{-4}$ Pa, the lithium fluoride film was formed at a film formation rate of 0.05 nm/sec, and the aluminum film was formed at a film formation rate of 1.0 to 1.2 nm/sec.

The thus obtained organic light-emitting device was covered with a protective glass plate in a dry air atmosphere so that the device was not degraded through adsorbing moisture, and was encapsulated with an acrylic resin adhesive.

When a voltage of 4.5 V was applied to the thus obtained device with the ITO electrode (anode 2) being used as a positive electrode and the aluminum electrode (cathode 4) being used as a negative electrode, emission of a green light derived from Compound 3 and having a maximum emission wavelength of 535 nm with an emission luminance of 1,650 $cd/m^2$ and an emission efficiency of 11.5 lm/W.

Furthermore, when a voltage was applied to the device in a nitrogen atmosphere for 100 hours so that the current density was kept at 30 $mA/cm^2$, the device emitted light at a luminance of about 5,500 $cd/m^2$ in an early stage and at about 5,000 $cd/m^2$ after the elapse of the 100 hours, which meant that the luminance degradation was small.

Energy Measurement

Evaporated thin films of the main component of the light-emitting layer; the main component of the hole-transporting layer; and the second component of the hole-transporting layer were produced, and their HOMO energies were measured in the atmosphere by using a photoelectron spectroscope AC-1 (trade name; manufactured by RIKEN KIKI CO., LTD.). Further, their LUMO energies were calculated from the measurement of an ultraviolet-visible absorption spectrum. Table 1 shows the results.

In addition, the main component of the hole-transporting layer and the second component of the hole-transporting layer were subjected to phosphorescence measurement at liquid-nitrogen temperature by use of a spectrophotometer (F4500 (trade name); manufactured by Hitachi High-Technologies Corporation)). Table 1 shows a T1 energy converted from the first light emission peak of a spectrum.

TABLE 1

| | Compound | HOMO (eV) | LUMO (eV) | Energy gap (eV) | T1 energy (eV) |
|---|---|---|---|---|---|
| Main component of light-emitting layer | Compound 2 | −5.72 | −2.78 | 2.94 | — |
| Main component of hole-transporting layer | TFLFL | −5.23 | −2.14 | 3.09 | 2.52 |
| Second component of hole-transporting layer | Compound 1 | −5.38 | −2.53 | 2.85 | 2.10 |

As shown in Table 1, the device of this example satisfies the relationship of E2−E1≦0.3 eV and the following conditions.
(1) The second component of the hole-transporting layer has a T1 energy smaller than the T1 energy of the main component of the hole-transporting layer.
(2) The second component of the hole-transporting layer has a LUMO energy higher than the LUMO energy of the main component of the light-emitting layer.
(3) The second component of the hole-transporting layer has an energy gap of 2.7 eV or more.

Comparative Example 1

A light-emitting device was produced by following the same procedure as in Example 1 with the exception that the hole-transporting layer 5 was constituted of only TFLFL.

When a voltage of 4.5 V was applied to the thus obtained device with the ITO electrode (anode) being used as a positive electrode and the aluminum electrode (cathode) being used as a negative electrode, emission of a green light derived from Compound 3 and having a maximum emission wavelength of 535 nm with an emission luminance of 1,790 cd/m$^2$ and an emission efficiency of 11.21 lm/W.

Furthermore, when a voltage was applied to the device in a nitrogen atmosphere for 100 hours so that the current density was kept at 30 mA/cm$^2$, the device emitted light at a luminance of about 5,400 cd/m$^2$ in an early stage and at about 4,320 cd/m$^2$ after the elapse of the 100 hours, which meant that the degradation was larger than that of Example 1.

Comparative Example 2

A device was produced in the same manner as in Example 1 except that rubrene shown below was used as the second component of the hole-transporting layer 5.

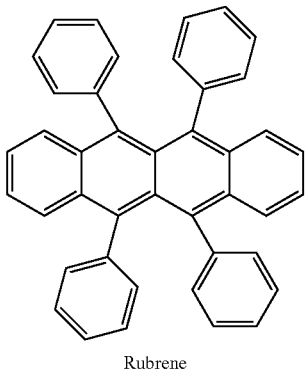

Rubrene

When the device was driven with the ITO electrode (anode) being used as a positive electrode and the aluminum electrode (cathode) being used as a negative electrode, light emission from rubrene and light emission from Compound 3 were simultaneously observed. In addition, when the driving voltage was changed, the emission color changed due to a change in the emission intensity ratio between rubrene and Compound 3, and the emission efficiency was lower.

Energy Measurement

The HOMO and LUMO energies of rubrene were measured to be −5.51 eV and −3.26 eV, respectively, and the energy gap was small. Further, rubrene had a LUMO energy lower than the LUMO energy of the main component (Compound 2) of the light-emitting layer. It is believed that rubrene emitted light for these reasons.

Example 2

A light-emitting device was produced by following the same procedure as in Example 1 with the exception that Compound 4 shown below was used as the main component of the light-emitting layer 3; Compound 5 shown below was used as a light-emitting dopant; and αNPD and Compound 6 shown below were used as the main component and second component of the hole-transporting layer 5, respectively.

Compound 4

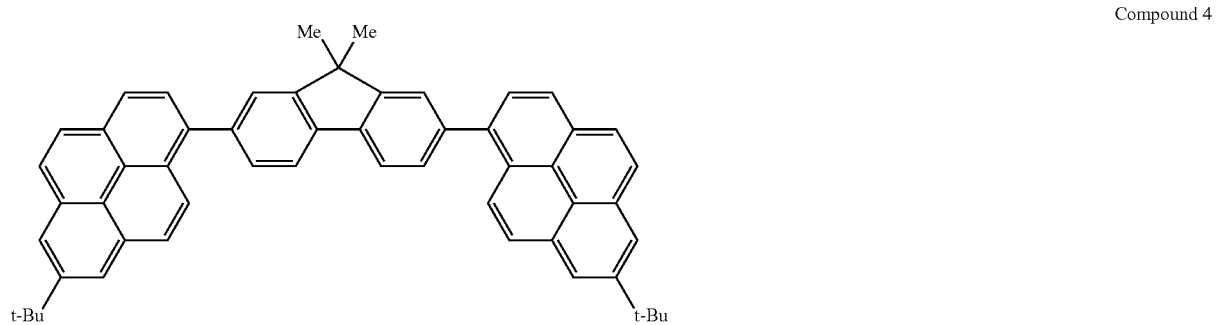

Compound 5

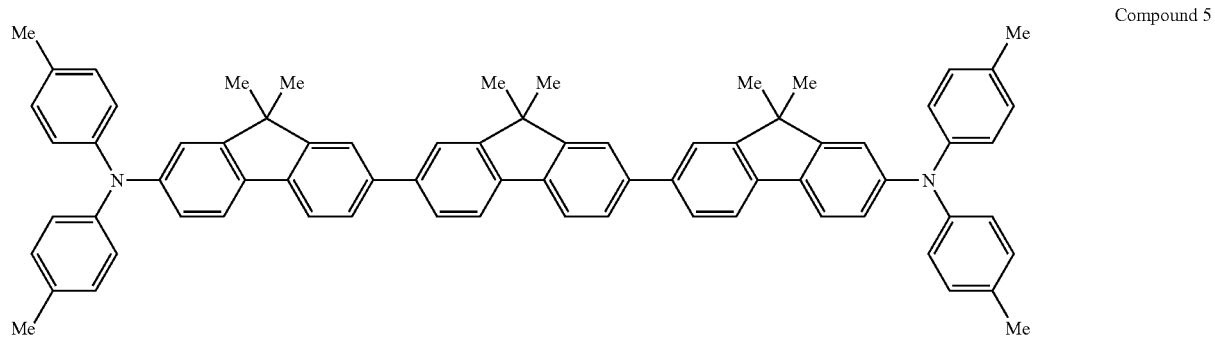

-continued

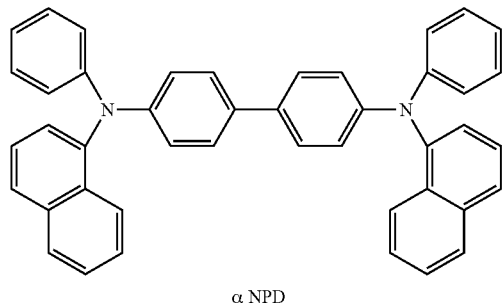

α NPD

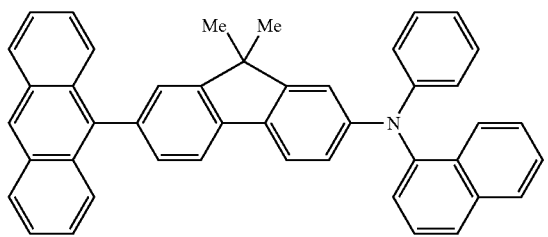

Compound 6

When a voltage of 4.5 V was applied to the thus obtained device with the ITO electrode (anode) being used as a positive electrode and the aluminum electrode (cathode) being used as a negative electrode, emission of a blue light derived from Compound 5 and having a maximum emission wavelength of 450 nm with an emission luminance of 300 cd/m² and an emission efficiency of 2.31 lm/W.

Furthermore, when a voltage was applied to the device in a nitrogen atmosphere for 100 hours so that the current density was kept at 30 mA/cm², the device emitted light at a luminance of about 1,100 cd/m² in an early stage and at about 930 cd/m² after the elapse of the 100 hours, which meant that the luminance degradation was small.

Energy Measurement

Table 2 shows the results obtained by measuring energies by following the same procedure as in Example 1.

TABLE 2

| | Compound | HOMO (eV) | LUMO (eV) | Energy gap (eV) | T1 energy (eV) |
|---|---|---|---|---|---|
| Main component of light-emitting layer | Compound 4 | −5.67 | −2.72 | 2.95 | — |
| Main component of hole-transporting layer | αNPD | −5.57 | −2.47 | 3.10 | 2.34 |
| Second component of hole-transporting layer | Compound 6 | −5.53 | −2.51 | 3.02 | 1.79 |

As shown in Table 2, the device of this example satisfies the relationship of E2−E1≦0.3 eV and the following conditions.
(1) The second component of the hole-transporting layer has a T1 energy smaller than the T1 energy of the main component of the hole-transporting layer.
(2) The second component of the hole-transporting layer has a LUMO energy higher than the LUMO energy of the main component of the light-emitting layer.
(3) The second component of the hole-transporting layer has an energy gap of 2.7 eV or more.

Comparative Example 3

A light-emitting device was produced by following the same procedure as in Example 2 with the exception that the hole-transporting layer 5 was constituted of only αNPD.

When a voltage of 4.5 V was applied to the thus obtained device with the ITO electrode (anode) being used as a positive electrode and the aluminum electrode (cathode) being used as a negative electrode, emission of a blue light derived from Compound 5 and having a maximum emission wavelength of 450 nm with an emission luminance of 360 cd/m² and an emission efficiency of 3.61 lm/W.

Furthermore, when a voltage was applied to the device in a nitrogen atmosphere for 100 hours so that the current density was kept at 30 mA/cm², the device emitted light at a luminance of about 1,100 cd/m² in an early stage and at about 720 cd/m² after the elapse of the 100 hours, which meant that the degradation was larger than that of Example 2.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-362611, filed Dec. 16, 2005, which is hereby incorporated by reference herein in its entirety.

What is claimed is:

1. An organic light-emitting device comprising a pair of electrodes including an anode and a cathode; and a light-emitting layer and a hole-transporting layer disposed between the pair of electrodes, an energy gap E1 of a main component of the light-emitting layer and an energy gap E2 of a main component of the hole-transporting layer satisfying the relationship of E2−E1≦0.3 eV, wherein the hole-transporting layer comprises a second component in addition to the main component of the hole-transporting layer;
(1) an energy of a lowest triplet excited state of the second component is less than an energy of a lowest triplet excited state of the main component of the hole-transporting layer;
(2) a lowest unoccupied molecular orbital energy of the second component is higher than a lowest unoccupied molecular orbital energy of the main component of the light-emitting layer; and
(3) the second component has an energy gap of 2.7 eV or more.

2. The organic light-emitting device according to claim 1, wherein the second component is contained in at least a portion on the light-emitting layer side of the hole-transporting layer.

3. The organic light-emitting device according to claim 1, wherein the energy of a lowest triplet excited state of the second component is 2.2 eV or less.

4. The organic light-emitting device according to claim 1, wherein the second component has a fused polycyclic aromatic ring having 14 or more carbon atoms.

5. The organic light-emitting device according to claim 1, wherein the second component has a triarylamine structure.

* * * * *